United States Patent [19]
Rostoker et al.

[11] Patent Number: 5,773,886
[45] Date of Patent: *Jun. 30, 1998

[54] SYSTEM HAVING STACKABLE HEAT SINK STRUCTURES

[75] Inventors: Michael D. Rostoker, Boulder Creek; Mark R. Schneider; Joseph H. Joroski, both of San Jose, all of Calif.

[73] Assignee: LSI Logic Corporation, Milpitas, Calif.

[*] Notice: The term of this patent shall not extend beyond the expiration date of Pat. No. 5,654,587.

[21] Appl. No.: 634,336

[22] Filed: Apr. 12, 1996

Related U.S. Application Data

[63] Continuation-in-part of Ser. No. 93,292, Jul. 15, 1993, abandoned.

[51] Int. Cl.[6] .............................. H01L 23/34; H01L 23/28
[52] U.S. Cl. ........................ 257/718; 257/722; 257/796; 361/703; 361/717; 165/803
[58] Field of Search ..................... 257/712, 713, 257/717, 718, 719, 722, 675, 721, 796; 165/80.3; 361/703, 717, 718, 719

[56] References Cited

U.S. PATENT DOCUMENTS

| | | | |
|---|---|---|---|
| 2,414,801 | 1/1947 | Clarke | 175/366 |
| 3,205,936 | 9/1965 | Katz | 165/80 |
| 3,372,733 | 3/1968 | Callender | 165/1 |
| 3,388,739 | 6/1968 | Olson et al. | 165/80 |
| 3,413,532 | 11/1968 | Boyer | 317/235 |
| 3,457,988 | 7/1969 | Meyerhoff et al. | 165/80 |
| 4,340,902 | 7/1982 | Honda et al. | 357/74 |
| 4,345,267 | 8/1982 | Corman et al. | 357/81 |
| 4,396,935 | 8/1983 | Schuck | 357/80 |
| 4,404,582 | 9/1983 | Pollard et al. | 357/79 |
| 4,535,384 | 8/1985 | Wakabayashi et al. | 361/386 |
| 4,620,215 | 10/1986 | Lee | 357/81 |
| 4,785,075 | 11/1988 | Shimp | 528/422 |
| 4,839,422 | 6/1989 | Craig, Jr. | 528/422 |
| 5,150,195 | 9/1992 | Nguyen | 357/72 |
| 5,155,066 | 10/1992 | Nguyen | 437/209 |
| 5,172,301 | 12/1992 | Schneider | 361/386 |
| 5,175,612 | 12/1992 | Long et al. | 257/667 |
| 5,227,663 | 7/1993 | Patil et al. | 257/718 |
| 5,292,930 | 3/1994 | Pitasi | 165/80.3 |
| 5,654,587 | 8/1997 | Schneider et al. | 257/718 |
| 5,693,981 | 12/1997 | Schneider et al. | 257/718 |

FOREIGN PATENT DOCUMENTS

| | | |
|---|---|---|
| 54-25168 | 2/1979 | Japan . |
| 59-117244 | 7/1984 | Japan . |
| 2-73657 | 3/1990 | Japan . |

OTHER PUBLICATIONS

St. Marys Carbon Company document entitled "Powder Metallurgy Division".

Sue Oliver. LSI Logic Corporation; My Hguyen and Michael Grosse, Johnson Matthey Electronics, "Siler/Pooolymer Die Attach for Ceramic Package Assembly,".

*Primary Examiner*—Tom Thomas
*Assistant Examiner*—David Ostrowski
*Attorney, Agent, or Firm*—Katz & Cotton, LLP

[57] ABSTRACT

Electronic systems utilizing a plurality of integrated circuit packages having a stackable heat sink assembly is formed by press-fit assembly of two or more identical fin layers. Each fin layer is formed using powdered metallurgy and has a button-like projection extending from its bottom surface and a recess opening in its top surface. The button-like projection and recess opening are sized and shaped such that an interference fit is formed when the buttonlike projection of one fin layer is pressed into the recess of another fin layer. The use of an adaptor to increase or decrease the effective size of the button-like projection of the bottom-most fin layer is described. Relieving gases that may be entrapped in the recess during assembly is described. Circular, elliptical and polygonal shapes (outlines) for the fin layers are described.

27 Claims, 15 Drawing Sheets

SYSTEM HAVING STACKABLE HEAT SINK STRUCTURES

CROSS REFERENCE TO RELATED PATENT APPLICATION

This patent application is a continuation-in-part of commonly owned U.S. patent application Ser. No. 08/093,292, filed Jul. 15, 1993, now abandoned entitled "STACKABLE HEATSINK STRUCTURES FOR SEMICONDUCTOR DEVICES AND METHOD OF MANUFACTURE," by Schneider et al., and is incorporated by reference herein.

BACKGROUND OF THE INVENTION

1. Technical Field of the Invention

The invention relates generally to electronic systems utilizing semiconductor device assemblies having heat sinks and, more particularly, to electronic systems utilizing semiconductor device assemblies having stackable heatsinks for the removal of heat generated by the semiconductor devices.

2. Background of the Related Art

Heat is inevitably generated during the operation of integrated circuit devices in an electronic system. In some instances, the amount of heat generated by the device can be sufficient to irreparably damage or even destroy the device. Continuing advances in the number of transistors and other functional elements contained in a single integrated circuit, and the increasingly high speeds at which integrated circuits now operate, both contribute to the problem of integrated circuit heat dissipation.

Electronic systems have progressively gotten smaller but have increased performance, reliability and features. This is the direct result of increased circuit complexity and the reduced sizes of semiconductor devices. The miniaturization of the semiconductor devices have permitted the integration of millions of transistor circuit elements into a single silicone embodied circuit. This increased circuit complexity in a reduced size semiconductor device has increased the need to adequately remove and dissipate heat generated from the active electronic circuits of the semiconductor device.

As used herein, a "semiconductor device" is a silicon chip (die) containing circuit elements. A "semiconductor device assembly" is a silicon chip contained within a package and connected (wired or bonded) to conductive leads which exit the package. It is generally well known to provide some sort of heat sink for semiconductor devices. A variety of methods and devices have been developed for removing at least some heat from an integrated circuit device. Typically a unitary heat sink structure has been used. Heat sinks generally include at least a heat-transferring portion proximate to the semiconductor device for extracting heat therefrom, and a heat-dissipating portion remote from the die with a large surface area for dissipating heat. The heat-dissipating portion is typically formed with a number of parallel layers, through which air passes to remove heat from the heat sink. Typically, the entire heat sink structure may simply be disposed on an exterior of a package, such as on the lid of a lidded package.

While perhaps suitable for some limited applications, these types of conventional heat sink devices are generally not commercially practical for use except in extreme instances, such as the microprocessor discussed above. Thus there stills exists a continuing need for practical methodologies and devices suitable for providing efficient heat dissipation to increasingly complex electronic systems utilizing integrated circuits.

Heat sinks are typically machined from metal stock, such as copper which has a high thermal conductivity. Evidently, many machine operations are required to form the heat sink fin layers, and much of the stock is removed in the machining operation. While the removed stock may be recovered, it represents initial waste.

The cost of machining is relatively high, and is exacerbated by the need to fabricate different heat sink structures for different devices. For example, one heat sink may have three fins, while another nearly identical heat sink requires five fins. With machining, there is little or no flexibility to accommodate differences from one heat sink to another;

U.S. Pat. No. 4,340,902 discloses a heat sinking arrangement wherein a cooling fin assembly is press-fitted around a cooling stud (see, e.g., FIG. 1 therein), and a similar arrangement wherein a cooling fin assembly is threaded onto a cooling stud (see, e.g., FIG. 2 therein). Also disclosed (see, e.g., FIGS. 3 and 4 therein) is an arrangement wherein a cooling stud is preformed with cooling fins in the form of a single unitary structure.

OBJECTS OF THE INVENTION

It is an object of the present invention to provide an electronic system with an improved heat sink and an improved technique for manufacturing electronic systems utilizing heat sinks.

It is another object of the invention to provide an electronic system having a heat sink structure that is readily adapted to a number of different system configurations.

SUMMARY OF THE INVENTION

The present invention provides for electronic systems utilizing semiconductor devices and integrated circuits having a novel heat sink structure formed from a plurality of individual and similar stackable layers. According to the invention, a heat sink is formed of a number "n" of similar, preferably identical, individual, stackable fin layers. The first bottom-most fin layer in the stack has a generally flat top surface with a generally centrally located recess extending into the top surface. The second and subsequent fin layers in the stack have a top surface similar (e.g., identical, including the recess) to the top surface of the first fin layer, and have a stepped bottom surface. A first projection extends from the bottom surface of fin layer, forming a "shoulder" for a second, smaller projection, extending generally centrally from the first projection, forming a button-like projection from the "shoulder" or first projection. The button-like projection is sized to fit into the recess in the top surface of the previous fin layer in an interference fit. Because of the interference fit, the second fin layer is assembled to the first fin layer by pressing them together under force. This button-like projection of the second fin layer is then "captured" by the recess in the top surface of the first fin layer, thereby forming a secure mechanical assembly of the two fin layers. Subsequent fin layers are assembled to the first and second fin layers in much the same manner. A plurality of fin layers can be assembled all at once by arranging them in a stack and pressing the entire stack together. The bottom surface of the bottom fin layer is preferably identical to the bottom surfaces of the remaining fin layers.

Each resulting fin layer is preferably disc-like, having a circular outline (plan view). However, to better match the outline of a package (which is typically not circular), the fin layers can be formed with polygonal or elliptical outlines. This will result in a greater surface area for each fin layer, within the "footprint" of the package. Similarly, the buttonlike projection, recess, and "shoulder" can be circular, elliptical, or polygonal. In the event that the outline of the fin layer is not circular (e.g., square, rectangular, or elliptical) then it has an inherent "orientation". Accordingly, in such cases it can be advantageous to form non-circular shapes for the button-like projection and recess to provide "keying", or common orientation between fin layers.

The recess is located generally in the center of the fin layer on the top surface (side). The "shoulder" is formed on the bottom side of the fin layer as a generally centrally located region of increased thickness. The button-like projection is disposed generally at the center of the fin layer, opposite the recess, and extending from the "shoulder" region of increased thickness. Intimate contact between the top surface of one fin layer and the shoulder of a subsequent fin layer ensures a good thermal path from layer-to-layer.

It should be understood that the button element can be provided on the top surface of the fin layer and the recess can be provided on the bottom surface of the fin layer, but this is not preferred.

In use, the fin layers are assembled together by press fit, and the assembly is mounted directly to a semiconductor die package, such as by gluing (with a thermally-conductive adhesive) to the lid of the package. Alternatively, an "adaptor" may be interposed between the bottom-most fin layer and the semiconductor package.

According to an aspect of the invention, the button element is slightly larger (e.g., in diameter) than the recess. For example, the button element may be one-half mil larger than the recess. Additionally, the button element may have a taper (draft), for example on the order of 3 degrees. This ensures a snug press fit between the assembled fin layers. Preferably, the recess is at least as deep as the height of the button-like projection, to ensure complete mating between adjacent fin layers.

According to a feature of the heatsink of the invention, either the recess or the button may be provided with a groove or hole for permitting potentially entrapped gases (e.g., air) to escape during the press fit procedure.

According to another feature of the heat sink of the invention, a thermally conductive substance, e.g., silicone grease, can be disposed between the assembled fin layers (e.g., spread on the shoulder of each fin layer) to improve thermal transfer from layer-to-layer. The use of thermal grease, while advantageous, if allowed to form a film on either the button or the recess may tend to increase the necessity for relief grooves or holes to permit entrapped gases to escape during assembly.

The fin layers are formed of a thermally-conductive material, such as copper, or a copper alloy. The top-most fin layer may have a top surface that is dissimilar from the top layers of the remaining fin layers, but this is not preferred.

The bottom-most fin layer may have a bottom surface that is dissimilar from the bottom surfaces of the remaining fin layers, so that the bottom-most fin layer is especially suited to being disposed in close proximity to a semiconductor die or its package, but this is not preferred. For example, the bottom surface of the bottommost fin layer may be formed to mate with an element of the semiconductor package (see, e.g., FIG. 3 of U.S. Pat. No. 5,175,612). Alternatively, the bottom surface of the bottommost fin layer can be identical to the bottom surfaces of the remaining fin layers, and an adaptor can be interposed between the bottom layers.

In use, the fin layers are assembled together by press fit, and the assembly is mounted directly to a semiconductor die package, such as by gluing (with a thermally-conductive adhesive) to the lid of a ridded package. Alternately, an "adaptor" may be interposed between the bottom-most fin layer and the semiconductor package, especially to accommodate a pre-formed recess or button in the semiconductor package.

According to the invention, any number "n" of fin layers may be pre-assembled together, prior to mounting to a semiconductor package. In this manner, a wide variety of heat sinks can be formed for different applications from a supply of identical fin layer elements.

According to an aspect of the heat sink of the invention, the fin layers are formed of powdered metal, or they may be formed of stamped out metal.

According to an aspect, the fin layers are assembled into a stack, so that the resulting heat sink has "n" fin layers, in accordance to the particular application for which it is intended.

Preferably, the fin layers are pressed together prior to assembling the heat sink to a semiconductor assembly. Alternatively, a first fin layer can be assembled to the semiconductor assembly and remaining fin layers can be pressed into the first in a separate operation. This is not preferred, however, as it may subject the semiconductor package to excessive forces.

The fin layers are preferably manufactured using powdered metal technology, (powder metallurgy) from thermally-conductive materials such as aluminum, copper, or copper/tungsten.

Powder metallurgy is a highly developed method of manufacturing reliable ferrous and nonferrous parts. Made by mixing elemental or alloy powders and compacting the mixture in a die, the resultant shapes are then sintered or heated in a controlled-atmosphere furnace to metallurgically bond the particles.

The advantages of using powder metallurgy (versus machining) include eliminating or minimizing machining and eliminating or minimizing scrap losses.

By using the stackable fin configuration and techniques for the heat sink of the present invention, an inexpensive heatsink is provided using powder metallurgy technology whereby inexpensive fin layers are pressed together to construct the desired number of fins which constitute the heatsink as a whole. Using powder metallurgy, copper may be cost effectively used as opposed to the costly machining techniques from raw metal stock. The heat sink of the semiconductor device of the system of the present invention provides a low-cost, high heat dissipation heat sink for systems utilizing semiconductor devices.

It is contemplated that the present invention may utilize system level products comprising single chip modules (SCM) often including other electrical components (such as capacitors, resistors, inductors, etc.); multi-chip modules (MCM) having at least two integrated circuit dice in the same or separate ceramic, resin, or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX telephone switching, voice mail, auto attendant, network controllers, video teleconferencing, digital data transmission (such as token ring, ethernet, ATM, or the like), and including subsystems or subassemblies for inclusion or attachment to more complex system level products.

From the above summary of the invention, it is clear the present invention provides both novel and nonobvious heat dissipation structures and methodologies suitable for use in connection with cooling integrated circuit devices used in an electronic system. Other and further objects, features and advantages will be apparent from the following description of a presently preferred embodiment of the invention, given for the purpose of disclosure and taken in conjunction with the accompanying drawings.

DETAILED DESCRIPTION OF THE INVENTION

The present invention is an electronic system utilizing at least one semiconductor integrated circuit having a stacked heat sink assembly formed from a number "n" of similar, preferably identical, individual, stackable fin layers. The first, bottom-most fin layer in the stack has a generally flat top surface with a generally centrally located recess extending into the top surface. The second and subsequent fin layers in the stack have a top surface similar (e.g., identical, including the recess) to the top surface of the first fin layer, and have a stepped bottom surface. A first projection extends from the bottom surface of fin layer, forming a "shoulder" for a second, smaller projection, extending generally centrally from the first projection, forming a button-like projection from the "shoulder" or first projection. The button like projection is sized to fit into the recess in the top surface of the previous fin layer in an interference fit.

Figure 1A:
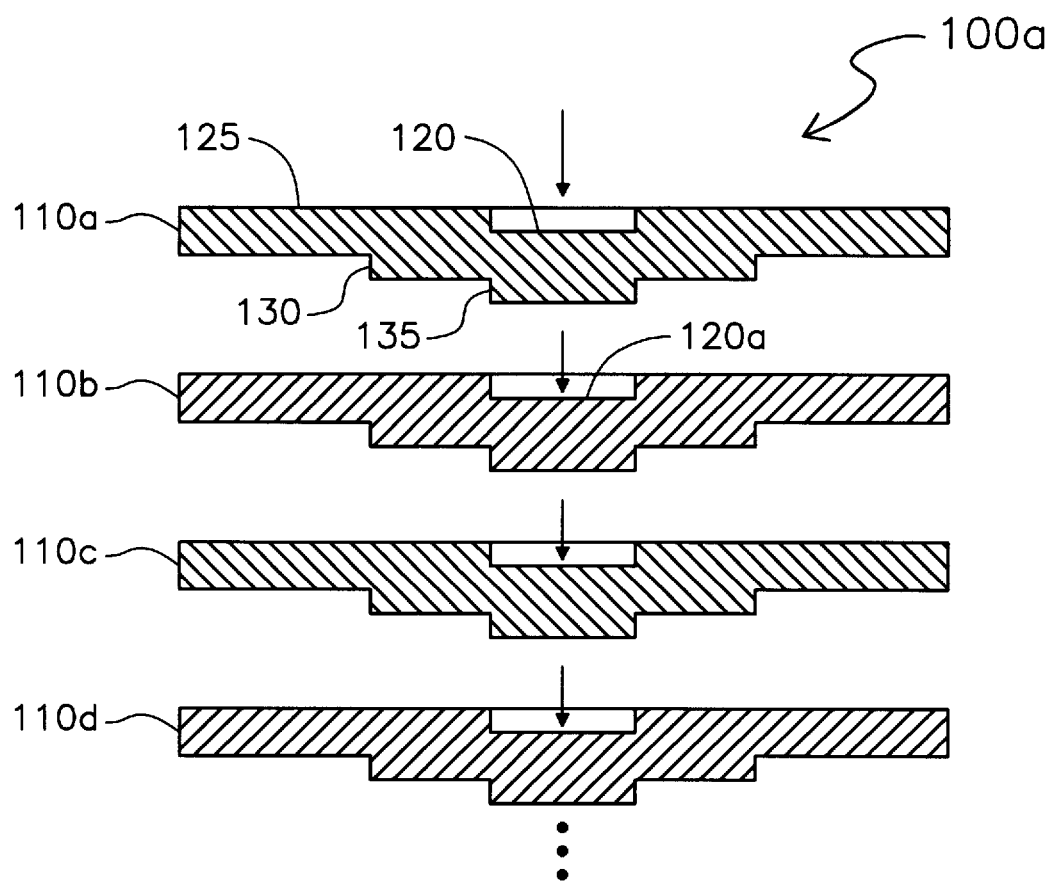
FIG. 1a is a cross-sectional view of four stackable fin layers of a stacked heat sink assembly, according to the invention, prior to assembly.

FIG. 1a shows such an arrangement 100a of fin layers, prior to assembly. The arrangement 100a includes four identical, fin layers 110a, 110b, 110c, and 110d. The topmost fin layer 110a, representative of the others (110b, c, and d) has a substantially flat top surface 125, with a recess 120 formed therein in a generally central location. An outer region of the fin layer 110a has a thickness "t".

A shoulder projection 130 extends from a central region of the bottom surface of the fin layer 110a. The shoulder region is somewhat thicker (such as twice as thick, or 2t) as the outer fin region.

A button-like projection 135, smaller (in width) than the shoulder projection 130, extends a distance approximately t/2 from a central portion of the shoulder projection 130. The button-like projection 135 is preferably located immediately under (opposite) the recess 120. Although not shown in the Figure, edges of the button-like projection 135 and recess 120 are preferably chamfered, to facilitate inserting the button-like projection 135 of one layer (e.g., 110a) into a recess 120a of the next lower fin layer (e.g., 110b) The four fin layers 110a, I 110b, 110c, and 110d are shown arranged in a stacked vertical configuration with the button-like projection of one fin layer positioned above and extending towards the recess of the next lower fin layer. The direction of assembly is shown with a series of arrows. The button-like projection 135 is slightly larger (e.g., in diameter) than the recess 120. For example, the button element may be one-half mil (0.0005 inches) larger than the recess. Additionally, the button element may have a taper (draft), for example on the order of 3 degrees. This ensures a snug press fit between the assembled fin layers. Preferably, the recess is at least as deep as the height of the button-like projection to ensure complete mating between adjacent fin layers.

The fin layers are preferably formed of powdered metal, but they may also be formed of stamped out metal. In either case, the fin layers are formed of a thermally-conductive material such as aluminum, copper, or copper/tungsten. Copper is a preferred choice of metals.

Figure 1B:
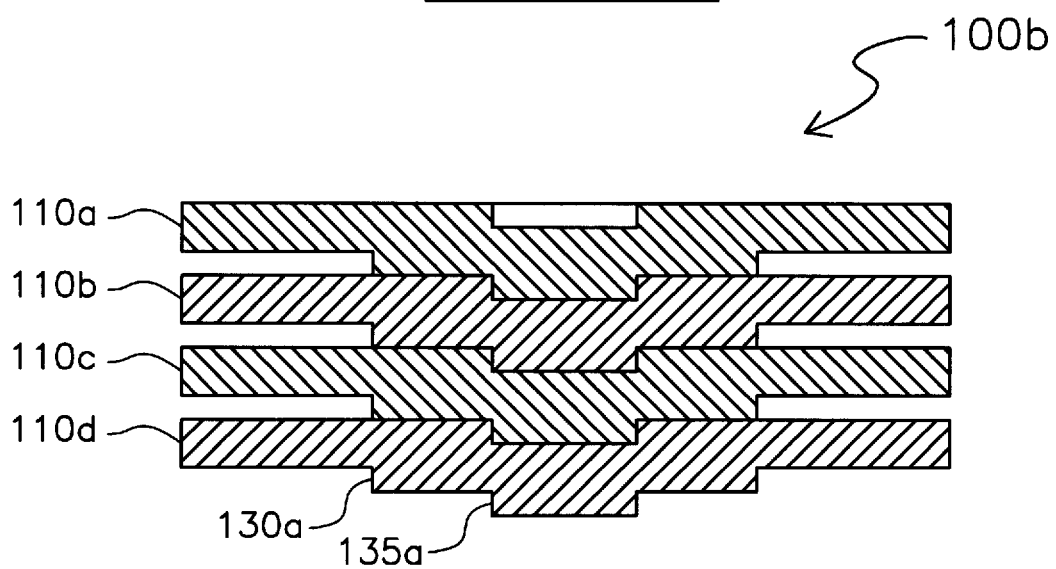
FIG. 1b is a cross-sectional view of an assembled heat sink assembly including four fin layers, according to the invention.

FIG. 1b shows an assembled stacked heat-sink assembly 110b, formed by pressing the arrangement 100a of FIG. 1a together in the direction shown by the arrows. A press fit is formed between the button-like projection of each fin layer and the recess of the next lower fin-layer. The shoulder projection 130a and button like projection of the bottom-most fin layer 110d extend from the bottom of the assembly.

The shoulder projection (e.g., 130) of each fin layer is in direct contact with a central region of the top surface of the next lower fin layer, providing good thermal conductivity therebetween.

In order to further promote thermal conductivity between fin layers of the stacked heat sink assembly, it is possible to dispose a small amount of a thermally conductive material, e.g., silicone grease (not shown), between the fin layers prior to assembly. The thermally conductive material, by increasing thermal contact area and by filling tiny gaps between the shoulder projections and top surfaces of the fin layers, serves to improve thermal conductivity between the fin layers.

Although FIGS. 1a and 1b depict an assembly of four fin layers, any number of fin layers greater than two can be assembled into a similar stacked heat sink assembly.

Each fin layer is preferably disc-like, having a circular outline (looking down onto the heat sink). However, the fin layers can also have polygonal or elliptical outlines.

Each button and recess (and shoulder portion) similarly have a circular outline (looking down onto the heat sink). However, the button and recess (and shoulder portion) can also have polygonal or elliptical outlines.

In the event that the overall shape (outline) of the fin layer is not circular (e.g., square, rectangular, elliptical) then it has an inherent "orientation" not found in circles. Accordingly, in such cases it can be advantageous to form non-circular, or otherwise "keyed" shapes for the button-like projection and recess to provide a common, uniform orientation for the assembler fin layers.

The top-most fin layer can have a top surface that is dissimilar from the top layers of the remaining fin layers, but this is not preferred. Similarly, the bottom-most fin layer can have a bottom surface that is dissimilar from the bottom surfaces of the remaining fin layers, but this is not preferred. It is preferred that each fin layer is a replication of each of the other fin layers.

In use, the fin layers are assembled together by press fitting, and the assembly is mounted directly to a semiconductor die package, such as by gluing (with a thermally-conductive adhesive) to an exterior surface of the package.

Alternatively, an "adaptor" may be interposed between the bottommost fin layer and the semiconductor package. Examples of such adapters are shown in FIGS. 2 and 3.

Figure 2:
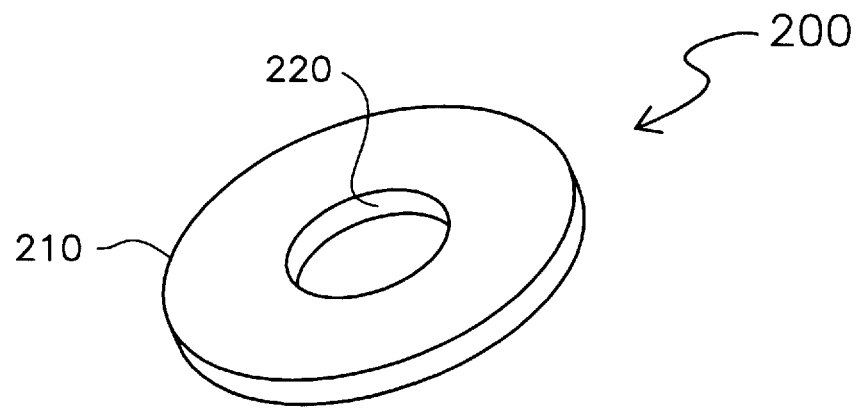
FIG. 2 is a perspective view of a doughnut-shaped adapter, according to the invention.

FIG. 2 is a perspective view of a diameter-increasing, doughnut-shaped adapter 200 used to increase the effective diameter of a round button-like projection of a fin layer (e.g., of the bottommost fin layer). A recess or hole 220, generally centrally located in the adapter 200, is sized and shaped to form an interference fit with a mating button-like projection (e.g., 135a, FIG. 1b). The outer edge 210 of the adapter effectively provides a larger diameter button-like projection from a fin layer to which the adaptor is assembled. This larger diameter projection can be used, for example to form an interference fit with a large (larger than the button-like projection of the fin layer) recess in a semiconductor package to which the stacked heat sink is to be assembled.

Additionally, the doughnut-shaped adapter 200 can be used simply to increase the effective surface area (footprint) available for adhesion to (and thermal conduction from) a planar surface of a semiconductor device package, such as to the lid of a lidded package. In this manner (using the adaptor 200), the bottom-most fin layer can have a button of greater effective contact area than the remaining fin layers, although the bottom-most fin layer is identical to each of the remaining fin layers.

Figure 3:
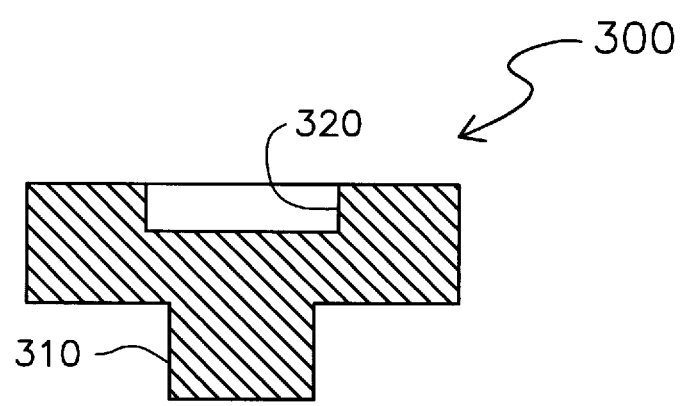
FIG. 3 is a cross-sectional view of a reducing adapter, according to the invention.

FIG. 3 is a cross-sectional view of a reducing adapter 300, having a top recess 320 sized to form a press fit (interference fit) with a button-like projection of a fin layer, and having a smaller button-like projection 310 opposite the recess. This adapter can be used to facilitate a press fit into a package recess which is smaller than the button-like projection of a fin layer.

Although the adapters 200 and 300 shown and described with respect to FIGS. 2 and 3, respectively are generally assumed to be round in shape, they can also be shaped to accept elliptical or polygonal button-like projections, and to provide non-circular button like projections (e.g., 310 FIG. 3) or outer surface shapes (e.g., 210, FIG. 2). In other words, the adaptor 200 may have a circular hole 220 for accepting the button of the bottom-most fin layer, and can have a square outline that matches the area of a lid of a ridded package.

Figure 4:
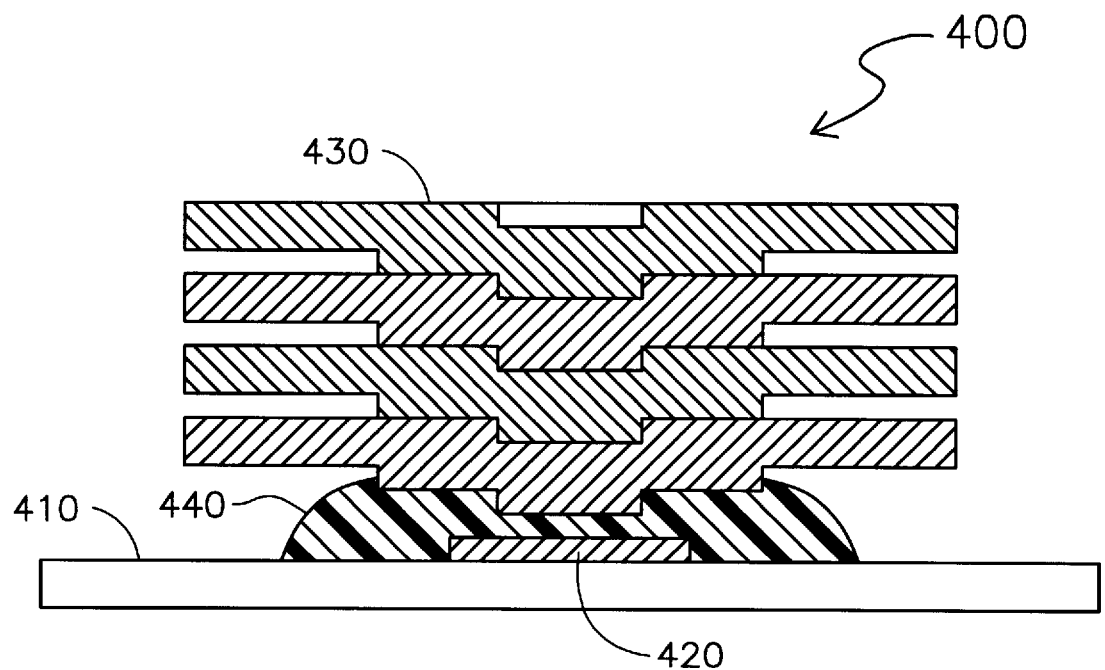
FIG. 4 is a cross-sectional view of an assembly of a stacked heat sink arrangement to a glob-top type package, according to the invention.
Figure 5:
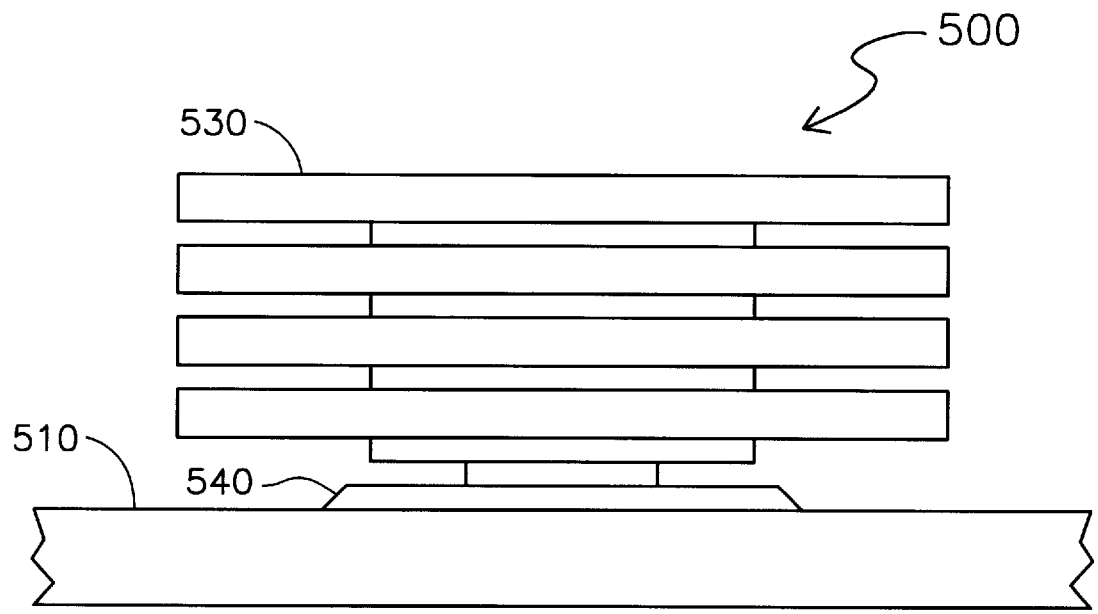
FIG. 5 is a view of an assembly of a stacked heat sink assembly to a lid of a lidded (e.g., ceramic) semiconductor device package, according to the semiconductor device package of the invention.

FIGS. 4 and 5 show examples of package assemblies incorporating the stacked heat-sink assemblies described hereinabove.

FIG. 4 is a cross-sectional view of a semiconductor package assembly 400 formed on a planar substrate 410. A semiconductor die 420 is attached to the planar substrate (e.g., with a suitable adhesive). Connections (not shown) are formed between the semiconductor die 420 and conductive traces (not shown) on the substrate. A dollop 440 of epoxy or other encapsulant is used to cover the die and its electrical connections. A stacked heat sink assembly 430 (see, e.g., 110b, FIG. 1b) is embedded in the epoxy dollop 440 such that the button-like projection on its bottom surface is in close proximity with the semiconductor die 420, thereby providing means for dissipating heat generated in the operation of the die 420.

FIG. 5 is a side view of another semiconductor package assembly 500 incorporating a stacked heat sink assembly 530. In this case a package 510, such as a ceramic package, with a metallic lid 540 is used. The stacked heat sink assembly is attached by its button-like projection to the lid 540 by using a heat conductive adhesive, thereby providing for heat transfer from the package by conduction from the lid 540. As mentioned above, an adaptor (e.g., 200) can be used to increase the contact area between the bottom-most fin layer and the lid of the package.

Figure 6A:
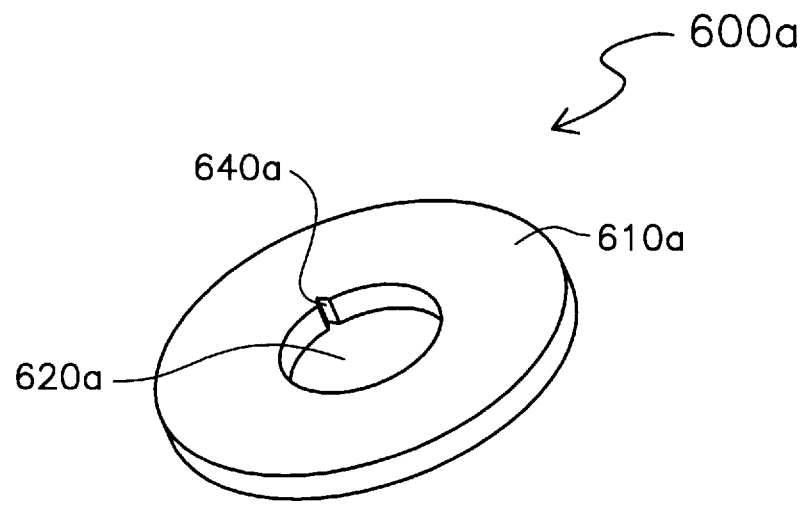
FIG. 6a is a perspective view of a fin layer incorporating a gas relief groove in the recessed portion thereof.
Figure 6B:
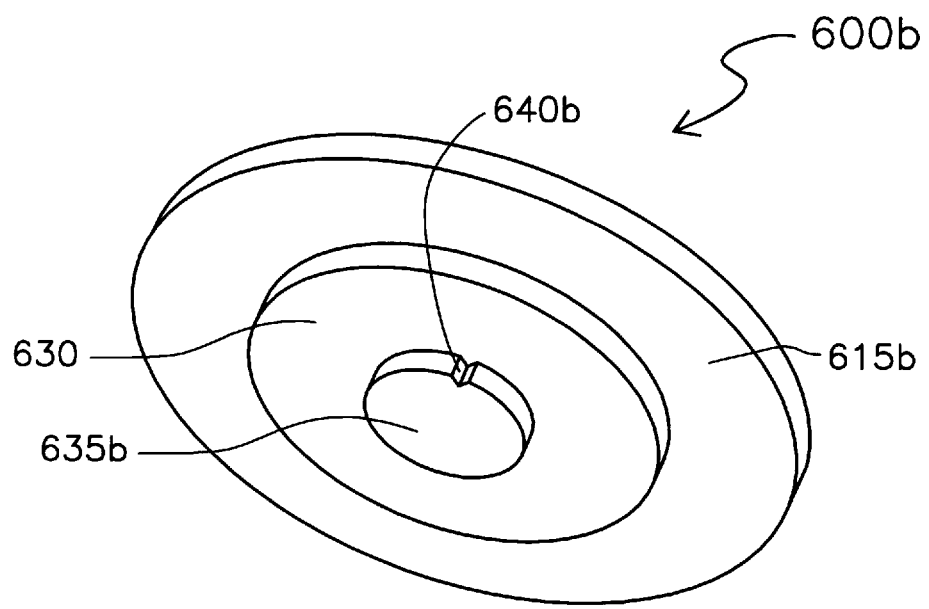
FIG. 6b perspective view of a fin layer incorporating a gas relief groove in the button-like projection portion thereof.
Figure 6C:
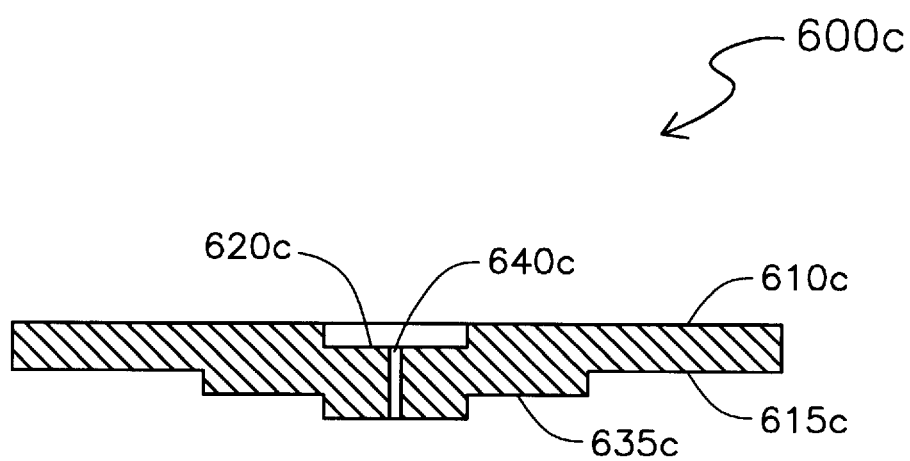
FIG. 6c is a cross-sectional view of a fin layer incorporating a gas relief hole.

In the process of press-fitting the fin layers together, it is possible that gases (air) will become entrapped in the recess, especially if thermal grease is used and forms a "sealing" film between the button and the recess. According to a feature of the invention, either the recess or the button may be provided with a groove or hole for permitting entrapped gases (e.g., air) to escape during the press fit procedure. FIGS. 6a–6c show various exemplary embodiments of gas relief grooves and holes.

FIG. 6a is a perspective view of a fin layer 600a, as viewed generally from the top. The top surface 610a of the fin layer 600a has a recess 620a extending therein, as described hereinabove (e.g., compare 120). A gas-relief groove 640a is formed in the side wall of the recess, providing a path for gas to escape during press fit with a button-like projection of another similar fin layer.

FIG. 6b is a perspective view of another fin layer 600b, as viewed generally from the bottom. A shoulder projection 630 extends from the bottom surface 615b of the fin layer 600b. A button-like projection 635b extends from the shoulder projection 630. A gas-relief groove 640b is formed in the button-like projection 635b to permit gases to escape during press-fit assembly to another similar fin layer.

FIG. 6c is a cross-sectional view of another fin layer 600c, illustrating yet another approach to permitting trapped gases to escape during press-fit assembly. The fin layer 600c (compare 430) has a generally flat top surface 610c. Extending into the top surface 610c is a recess 620c. Extending from a bottom surface 615c of the fin layer 600c is button-like projection 635c, located directly under the recess 620c. A gas-relief hole 640c extends from the center of the button-like projection completely through the fin layer 600c to the recess 620c on the opposite side or the fin layer 600c. The hole 640c is yet another way of permitting trapped gases to escape during press-fit assembly.

Gas-relief holes may not be necessary in all assemblies, since many possible fin layer designs will not trap enough gas or build up enough pressure to interfere with press-fit assembly or functioning of the stacked heat sink assembly.

According to the invention, any number "n" of fin layers may be pre-assembled together, prior to mounting to a semiconductor package. In this manner, a wide variety of heat sinks can be formed for different applications from a supply of identical fin layer elements.

According to an aspect of the heatsink of the invention, the fin layers are assembled into a stack, so that the resulting heat sink has "n" fin layers, in accordance to the particular application for which it is intended.

Preferably, the fin layers are pressed together prior to assembling the heat sink to a semiconductor assembly. Alternatively, a first fin layer can be assembled to the semiconductor assembly and remaining fin layers can be pressed into the first in a separate operation. This is not preferred, however, as it may subject the semiconductor package to excessive forces.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Figure 7:
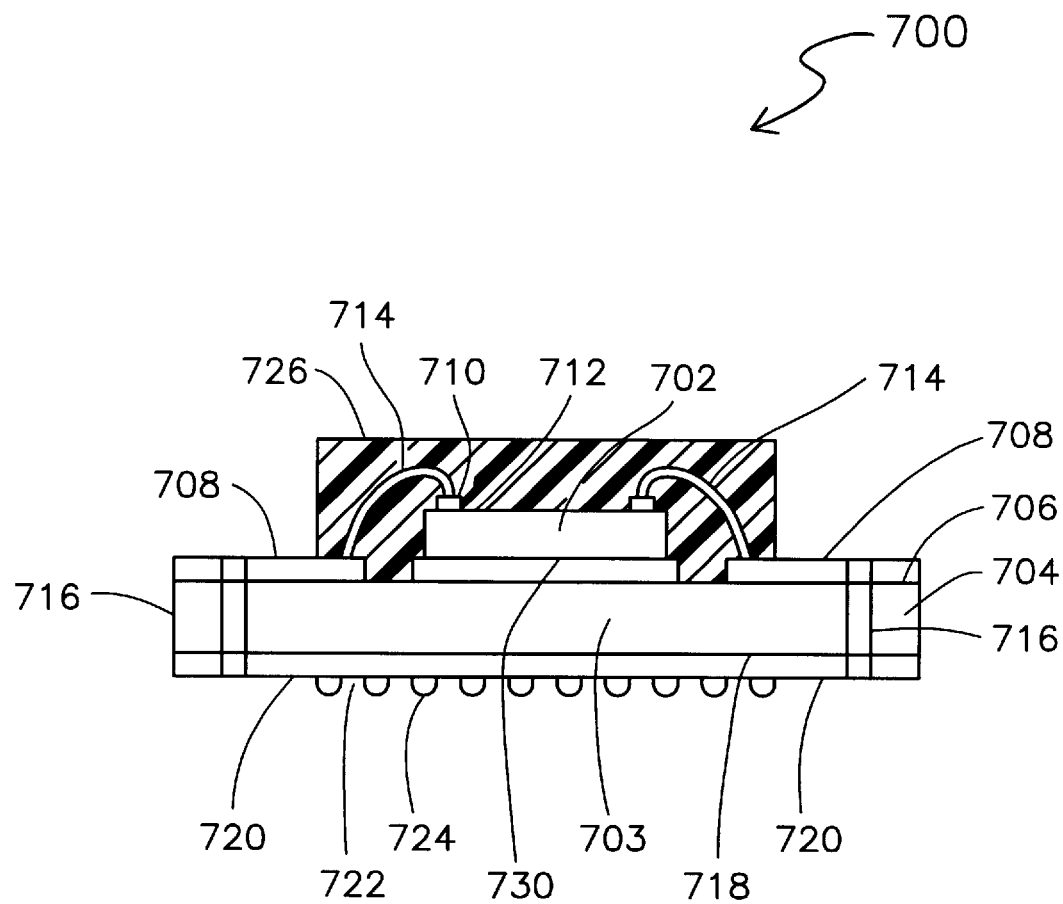
FIG. 7 is a schematic elevational view of a single chip module illustrated in cross section.

Referring to FIG. 7, a schematic elevational view of a SCM is illustrated in cross section. The SCM 700, as illustrated, is a ball bump grid array semiconductor package. A semiconductor die 702 is mounted to the top surface of a central area 703 of a substrate 704. The semiconductor die has conductive lines 712 formed thereon (not illustrated). The top surface 706 of the substrate 704 is provided with a number of conductive traces 708 that extend from near the periphery of the substrate 704 to the central area 703. The die 702 has bond pads 710 thereon. Bond wires 714 extend from the bond pads 710 to inner ends of the traces 708. Near the periphery of the substrate 704, there are plated (conductive) through-holes (vias) 716 extending from the bottom surface 718 of the substrate 704, through the substrate to a respective trace 708. The bottom surface 718 of the substrate is provided with a number of conductive traces 720, each having an end connected with a respective via 716. In this manner, signals (and power) to and from the die are connected through the bond wires 714, through the top side traces 708, through the vias 716, to the bottom side traces 720. Solder balls 724 are attached to the traces 720. A package body 726 is formed over the die 702, and partially covers the top surface of the substrate 704.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 704 of FIG. 7) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 8:
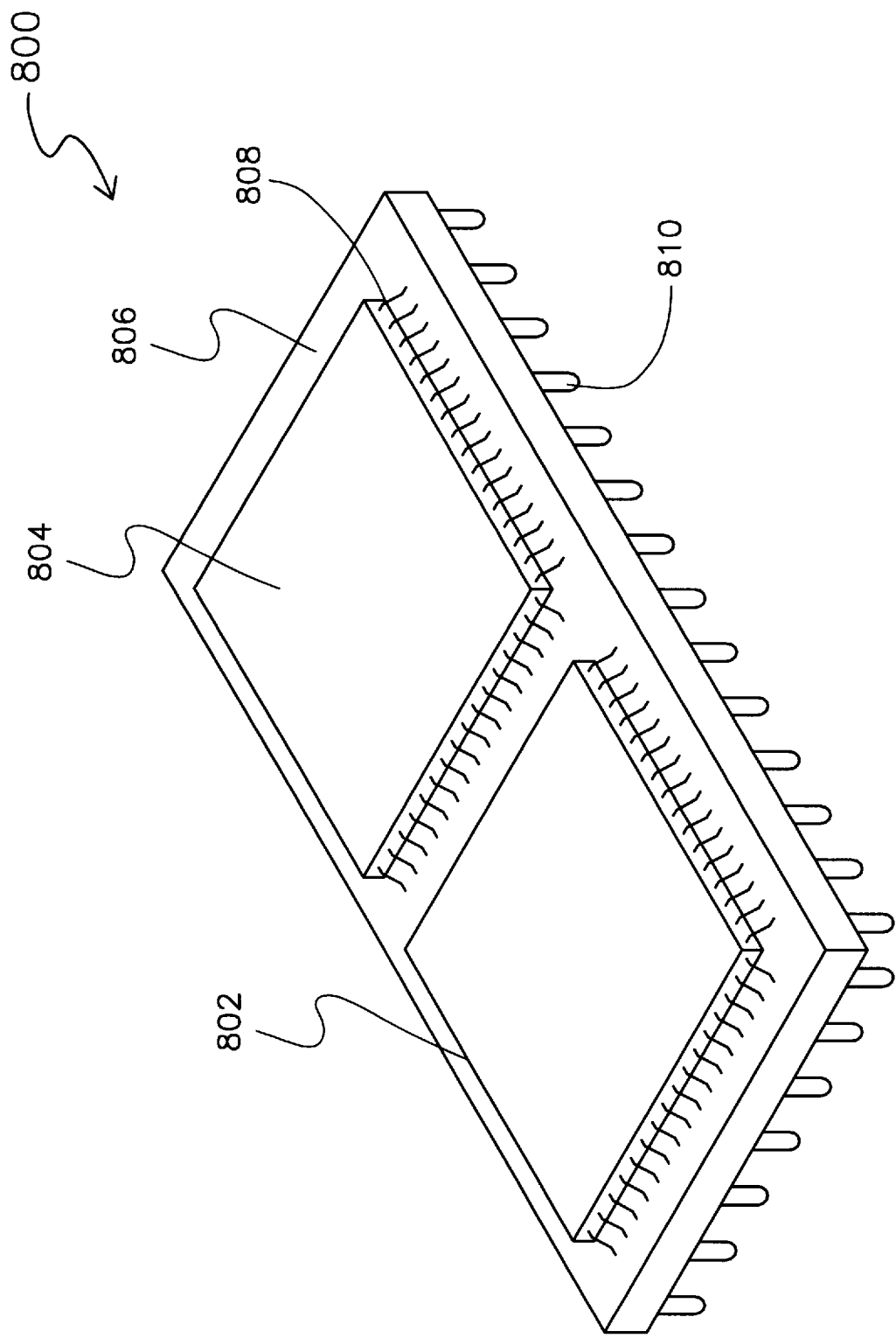
FIG. 8 is a schematic perspective view of a multi-chip module.

FIG. 8 illustrates a schematic perspective view of a MCM. MCM 800 comprises a substrate 806 having conductive lines formed thereon (not illustrated), at least two semiconductor dies 802 and 804 disposed on the substrate 806 and electrically connected to conductive lines (not illustrated) of the substrate 806 by the outer tips of lead frame leads 808. The dies 802 and 804 may be physically mounted to the substrate 806. The two semiconductor dies 802 and 804 are illustrated encapsulated, however, non-encapsulated flip-chip ball bump dies are also contemplated. One or more layers of conductive traces and plated through-holes (not illustrated) may be disposed within substrate 806 and are used to connect the semiconductor dies 802 and 804 to one another and to external connections 810, such as the solder ball bump structures as described above. Additional electrical components, such as capacitors, resistors and inductors (not illustrated) may also be disposed on and connected to the substrate 806. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 9:
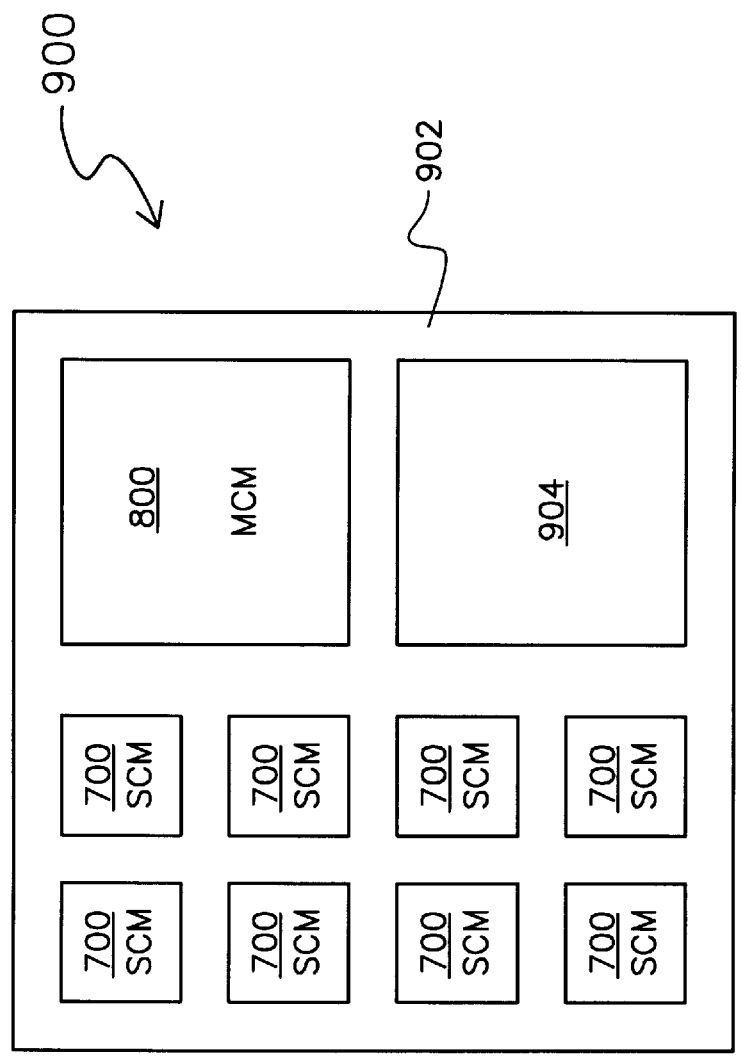
FIG. 9 is a schematic top view of a board level product.

FIG. 9 illustrates a schematic top view of a board level product (BLP). The BLP 900 comprises an array of SCMs 700, a MCM 800, and a memory component 804. The SCMs 700, the MCM 800, and memory 904 are each disposed on and connected to a printed wiring board 902. The printed wiring board 902 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Figure 10:
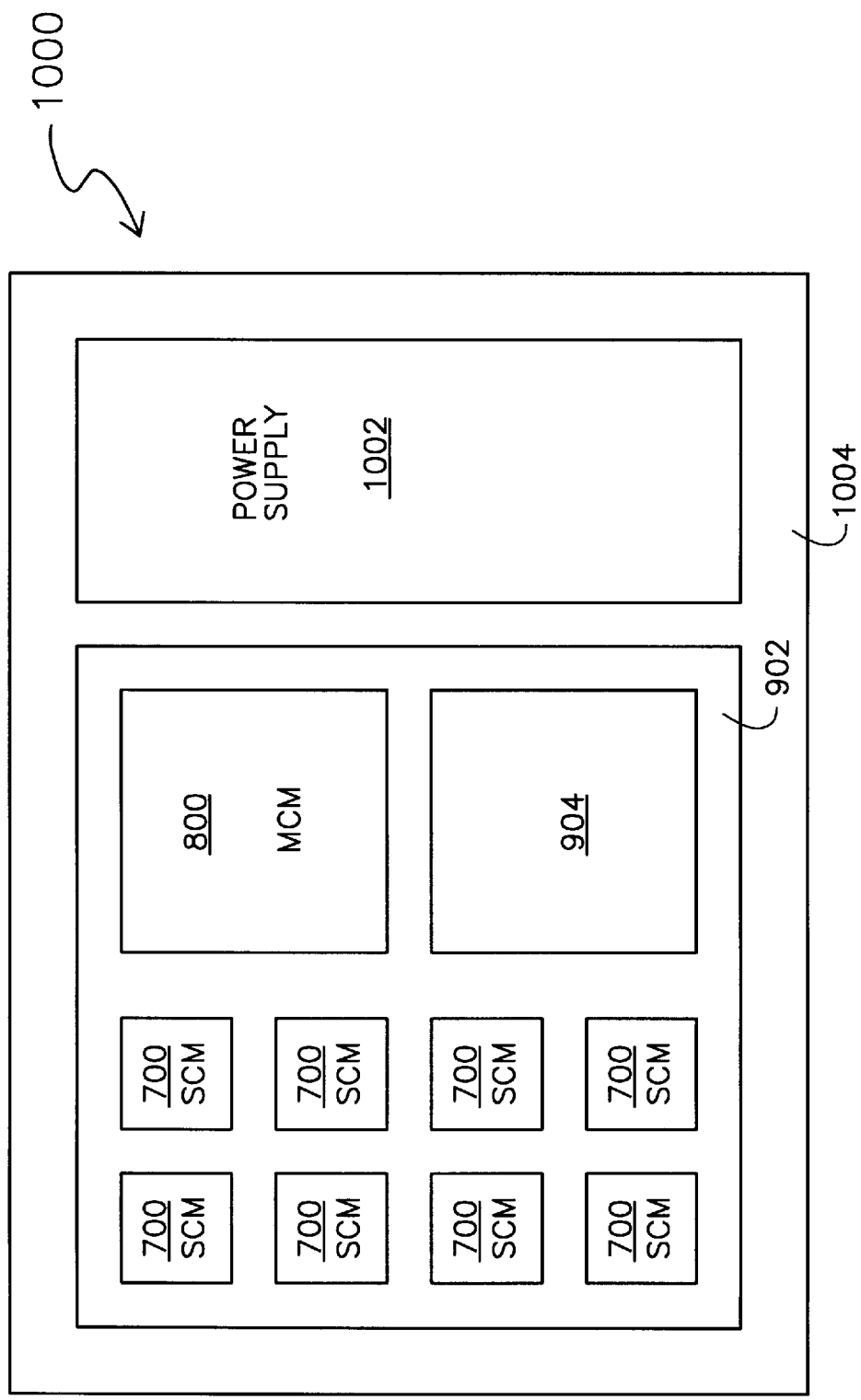
FIG. 10 is a schematic top view of a box level product.

FIG. 10 illustrates a schematic top view of a box level product. The box level product 1000 comprises at least one printed wiring board 902 as described above, a power supply 1002 and an enclosure or box 1004 containing the at least one board 902 and the power supply 1002. One or more box level products may be used to create more complex systems according to the present invention.

Figure 11:
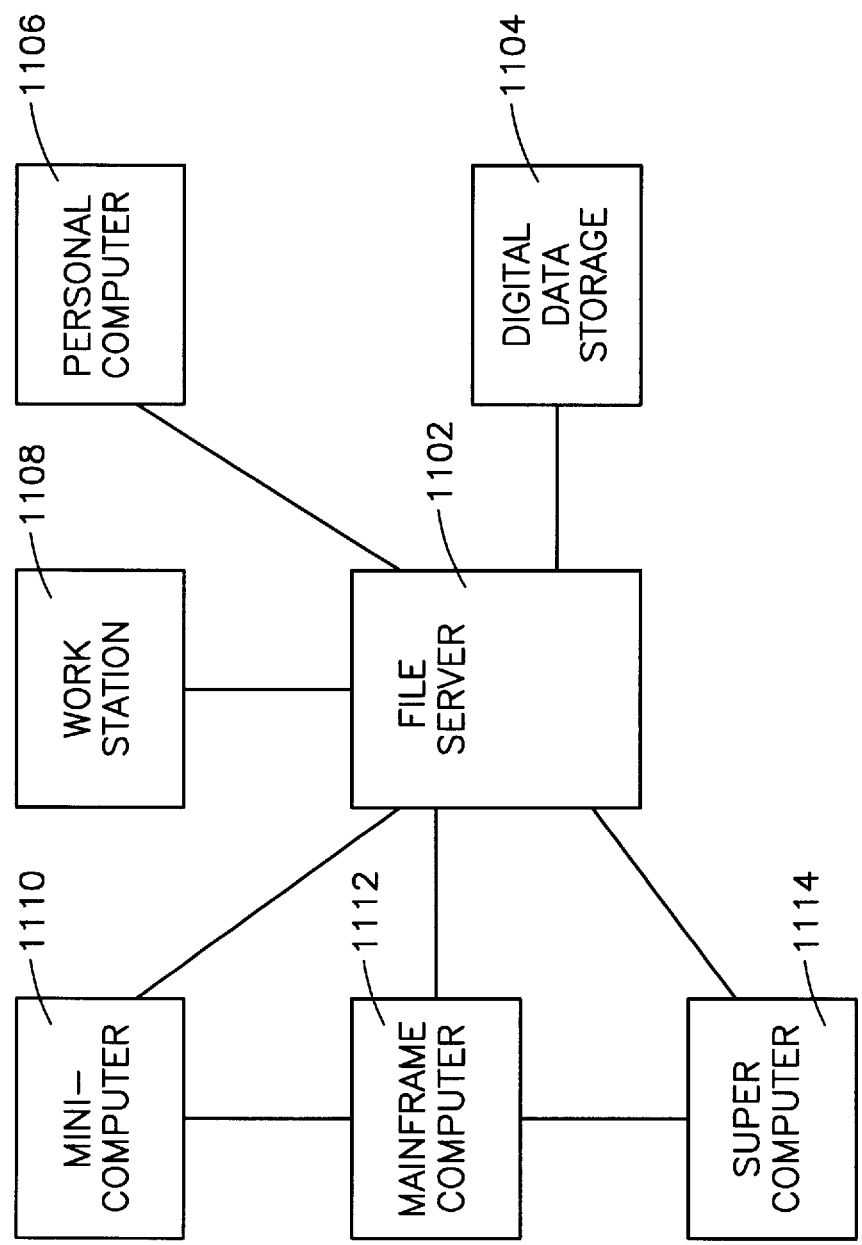
FIG. 11 a schematic block diagram of a computer system.

FIG. 11 illustrates a schematic block diagram of various computer systems interconnected together via various digital data transmission systems. A file server 1102 is connected to a digital data storage device 1104 such as, for example, magnetic hard disk, tape, optical disk, flash memory, core memory, semiconductor memory and the like. The server 1102 may be connected to at least one personal computer 1106, a work station 1108, a minicomputer 1110, a mainframe computer 1112, and a super computer 1114 through a number of digital data transmission system networks such as token ring, star, coaxial, fiber-optic and the like. These networks may utilize data protocols such as Scaleable Coherent Interface ("SCI"), ANSI/IEEE Std 1596-1992 SCI, Asynchronous Transfer Mode ("ATM"), FiberChannel, SerialBus, SCSI, SSA, QuickRing, HIPPI, FDDI, Ethernet and the like.

Figure 12:
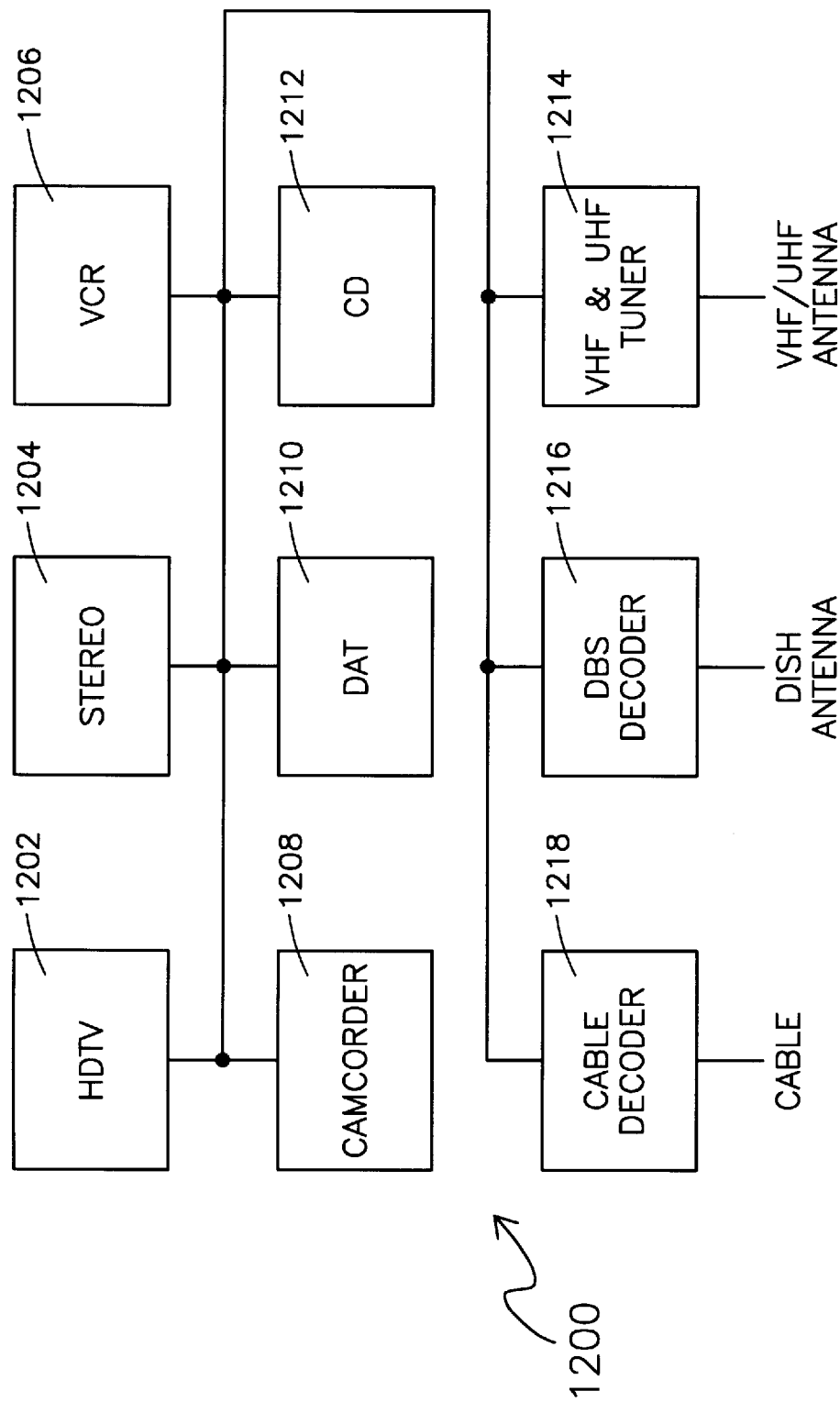
FIG. 12 a schematic block diagram of an entertainment system.

FIG. 12 is a schematic block diagram of an entertainment system according to the present invention. The entertainment system 1200 may be comprised of the following component subsystems: a high definition television (HDTV) 1202, a stereo 1204, a video cassette recorder (VCR) 1206, a television camera/recorder (Camcorder) 1208, a digital audio tape unit (DAT) 1210, a compact disk player (CD) 1212, a VHF/UHF tuner 1214, a direct broadcast satellite (DBS) decoder 1216, and a cable decoder 1218. These component subsystems are made up of SCM, MCM, BLP and boxes as disclosed above.

Figure 13:
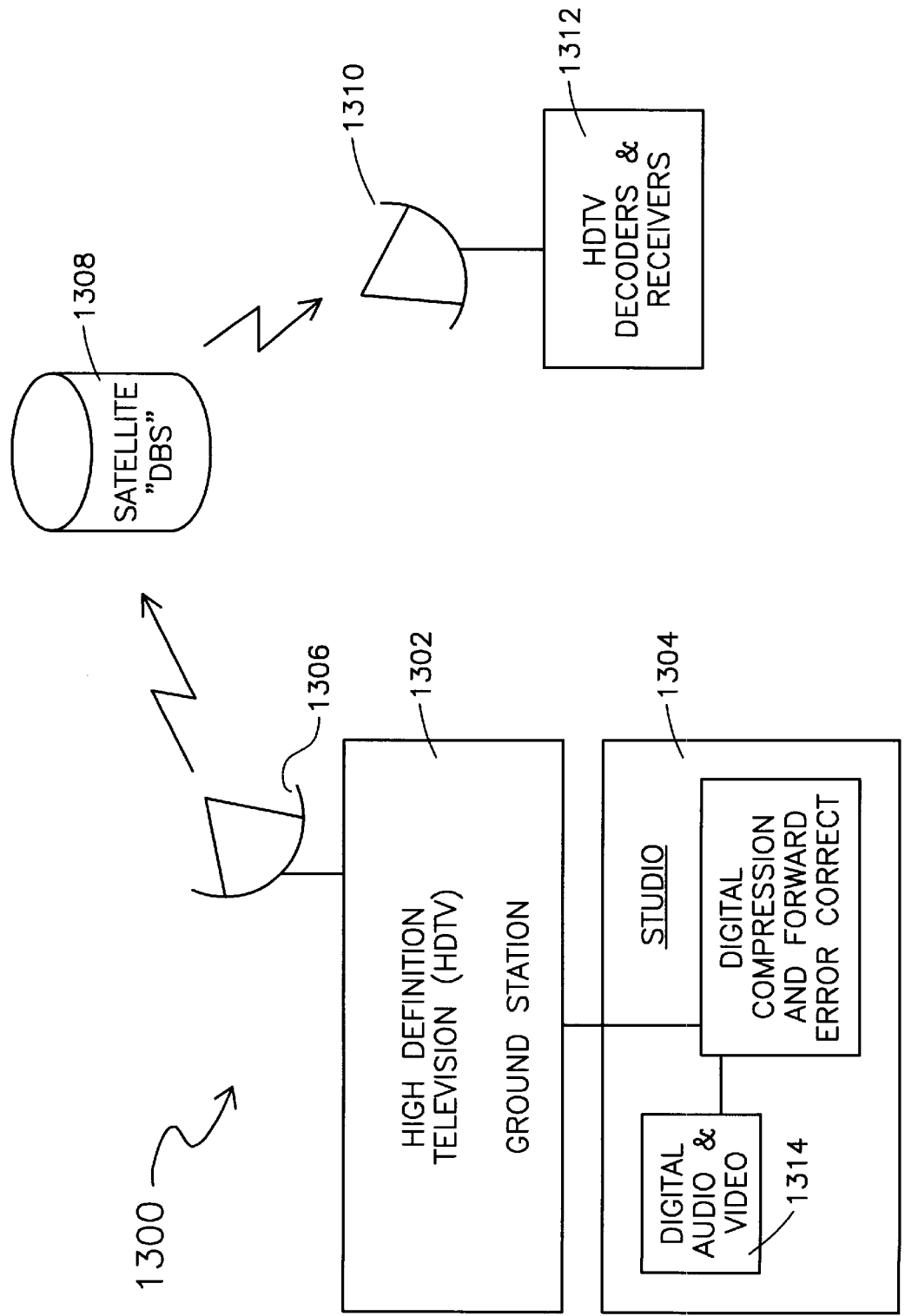
FIG. 13 is a schematic block diagram of an information and entertainment transmission system.

The DBS decoder 1216 receives a digitally encoded and forward error corrected signal from a dish antenna (not illustrated) which receives a DBS entertainment signal from a geosynchronous satellite (see FIG. 13). Hardwired cable is connected to the cable decoder 1218 which decodes and converts the cable entertainment channels to signals for viewing on the HDTV 1202 or a standard television (not illustrated). Standard broadcast television and stereo signals may be received by the VHF/UHF tuner 1214 and the base band signals made available to the HDTV 1202, stereo 1204 and the other recording devices (VCR 1206, DAT 1210). Similarly, recorded entertainment information may be played on the HDTV 1202 and stereo 1204 from the playback devices (DAT 1210, Camcorder 1208, CD 1212, VCR 1206) for viewing and listening enjoyment by the user.

FIG. 13 is a schematic block diagram of an information and entertainment communications system according to the present invention. The information and entertainment communications system 1300 is comprised of the following systems: A HDTV ground station 1302 which transmits a digitally encoded and forward error corrected signal from the HDTV studio 1304 by microwave dish 1306 to a DBS satellite 1308. The satellite 1308 rebroadcasts the signal from the studio 1304 to a plurality of ground station dish antennas 1310 which are connected to corresponding HDTV receivers/decoders 1312 where the DBS satellite signal is processed and made available, for example, to the entertainment system 1200. The system 1300 is comprised of many SCM, MCM, BLP and box level subsystems which greatly benefit from the features, aspects and advantages of the present invention. Some of these subsystems are a digital audio and video formatting subsystem 1314 which convert the analog entertainment information into a digital format, and a digital compression and forward error connection subsystem 1316 which prepares the digitally encoded entertainment information for transmission by the ground station 1302 to the satellite 1308.

Figure 14:
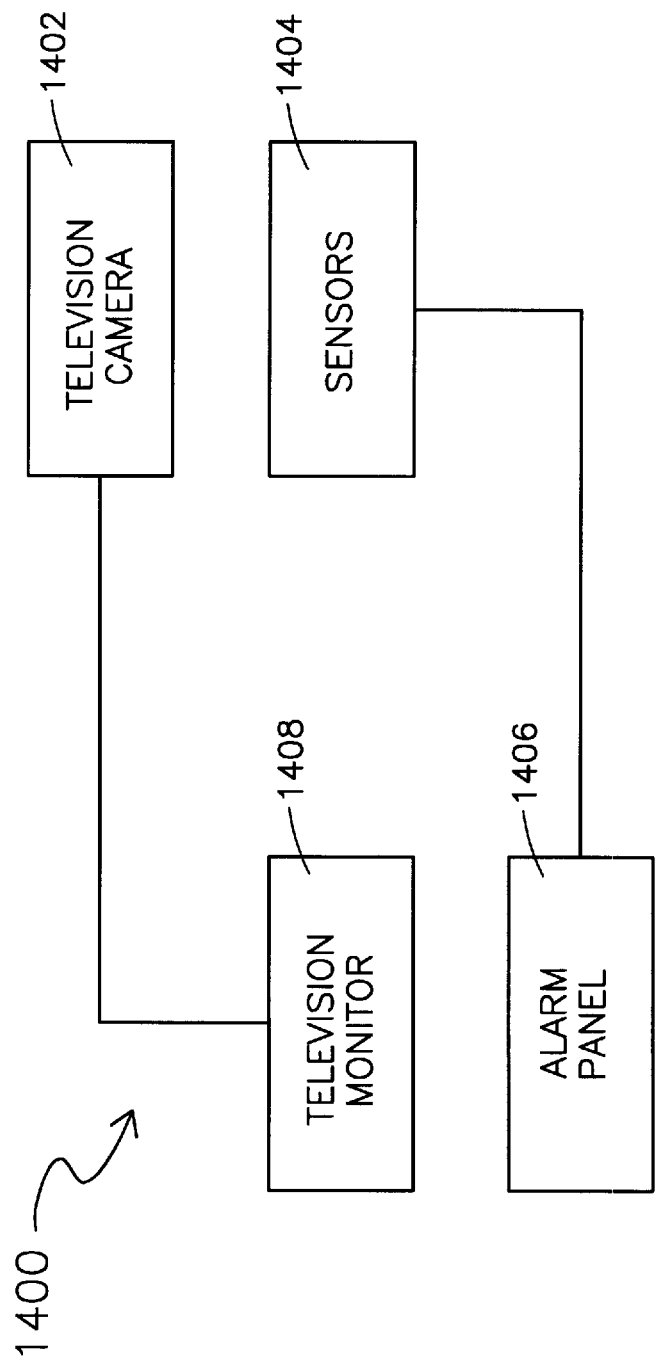
FIG. 14 is a schematic block diagram of a security and surveillance system.

FIG. 14 is a schematic block diagram of a security and surveillance system according to the present invention. The security and surveillance system 1400 is comprised of the following subsystems: A television camera 1402, intrusion detection sensors 1404, a sensor alarm panel 1406, and a television monitor 1408. The television monitor 1408 displays what the television camera(s) 1402 observe. The alarm panel 1406 displays the status of the sensors 1404 and will annunciate an alert upon a sensed alarm condition. The system 1400 may be utilized in homes, businesses, government building, military bases, prisons and any area requiring security and surveillance.

Figure 16:
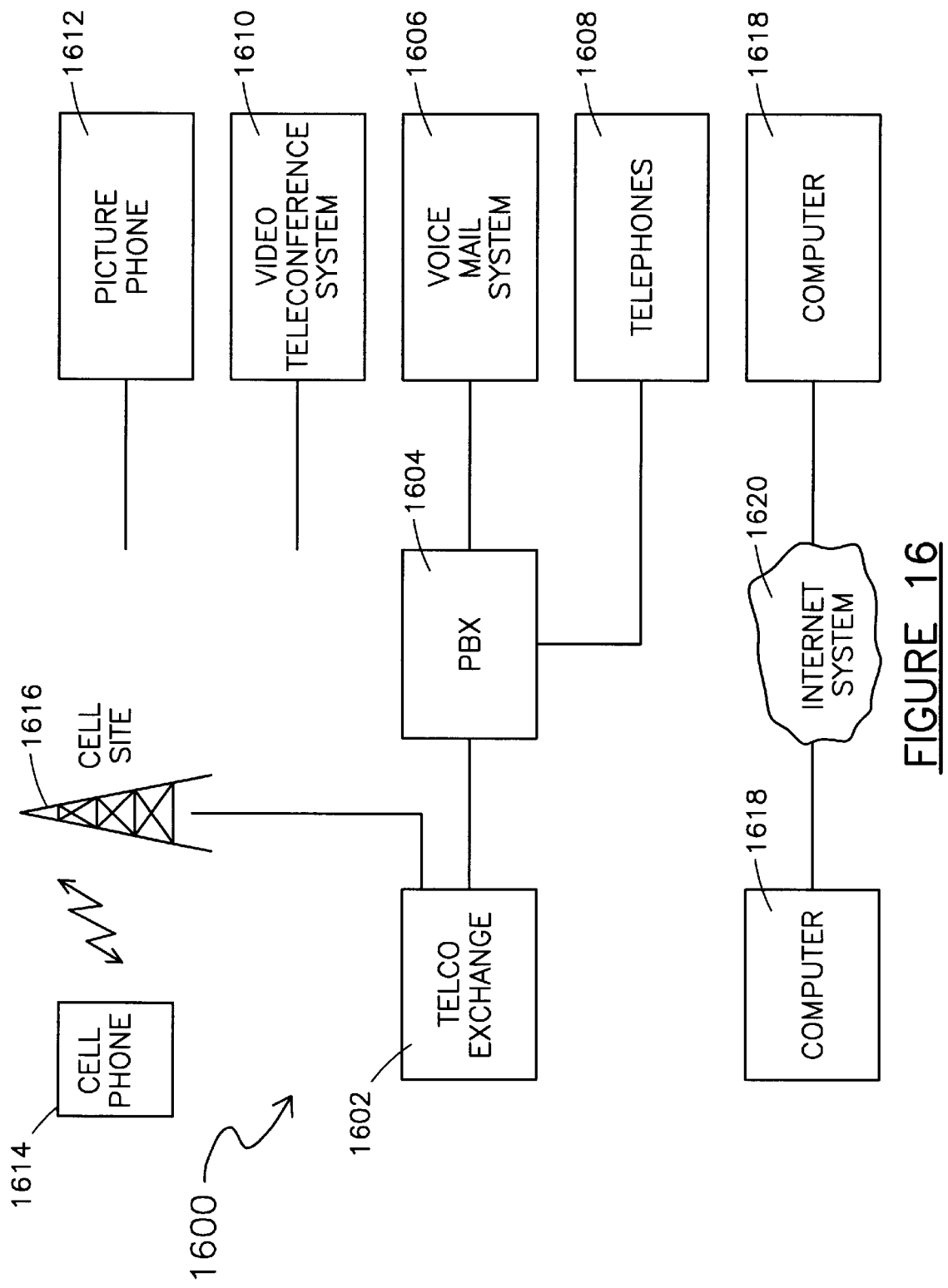
FIG. 16 is a schematic block diagram of a plurality of communications and information transmission systems.

In addition, another embodiment of the security and surveillance system 1400 may be utilized to monitor operating conditions of transportation systems such as engine status, hull integrity, operating temperatures, maintenance evaluation and other parameters deemed necessary for the safe and efficient operation of the transportation systems (see FIG. 16). In a further embodiment of subsystems for the transportation systems, positioning and navigational (GPS) systems may be utilized for hazard avoidance, as well as radar and sonar (see FIG. 16). Further, operation of the transportation systems may be implemented by digital control, such as "fly-by-wire," along with the monitoring thereof. The system 1400 and its subsystems may be utilized with the other system embodiments disclosed herein and will greatly benefit from the features, aspects and advantages of invention as disclosed hereinabove.

Figure 15:
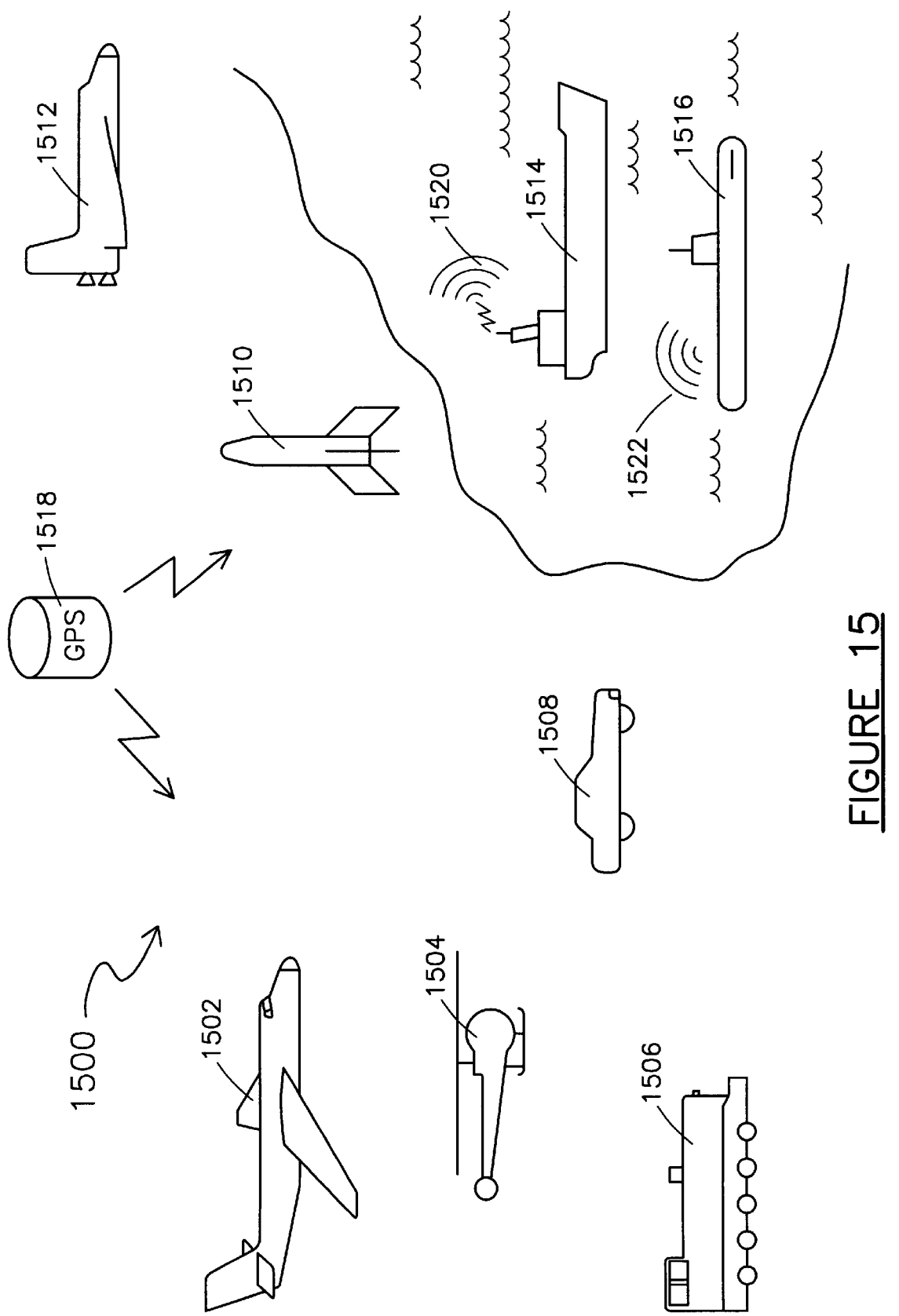
FIG. 15 is a schematic block diagram of a plurality of transportation systems.

FIG. 15 is a schematic block diagram of a plurality of transportation systems according to the present invention. The transportation systems, generally referenced to by the numeral 1500, may utilize, individually or in combination, the aforementioned systems to great advantage. Embodiments of the transportation system 1500 is as follows: An airplane 1502, a helicopter 1504, a train 1506, a vehicle 1508 such as an automobile or truck, a rocket 1510, a space shuttle 1512, a ship 1514, a submarine 1516, and the like. Each of the embodiments of the transportation systems 1500 contemplated herein may greatly benefit from the communications, navigation and control systems disclosed herein along with he features, aspects and advantages of the present invention.

Each of the embodiments of the transportation systems 1500 may utilize a positioning and navigation system which derives its position information from a global positioning satellite system (GPS) 1518. The positioning and navigation system is comprised of SCM, MCM, BLP and box level systems as discussed hereinabove. Radar 1520 and/or sonar 1522 systems may be utilized for collusion avoidance and location and may be incorporated with any of the transportation systems 1500.

FIG. 16 is a schematic block diagram of a plurality of communications and information transmission systems according to the present invention. The communications and information transmission systems 1600 may comprise, individually or in combination, a telephone exchange 1602, a PBX 1604, a voice mail system 1606, telephones 1608, a video teleconferencing system 1610, a video picture telephone 1612 and the like. The systems 1600 may also comprise a cellular telephone 1614, and a plurality of cell sites 1616 which may be connected with the telephone system 1602. Further, systems 1600 may be computers 1618 connected together through the internet system 1620. Both analog and digital communications are contemplated herein with the various features, advantages and aspects of the present invention.

Other MCM, SCM, mini-board, micro-board, board level and other system sub-assemblies are contemplated using the transfer molded heat sink semiconductor device packages of the present invention. Additionally, such sub-assemblies or packages using such transfer molded heat sink semiconductor device packages may be used in traditional circuit boards or sub-assemblies for a system level product. Examples of electronic systems that may benefit from the system and method of the present invention have been mentioned above. The spirit and intent of the present invention is to improve the reliability, operating speed and reduce the size of all electronic systems from a single semiconductor integrated circuit die to a complex multiple box electronic system.

By using the stackable fin configuration and techniques of the heatsink of the present invention, an inexpensive heat sink is provided using powder metallurgy technology whereby inexpensive fin layers are pressed together to construct the desired number of fins which constitute the heat sink as a whole. Using powder metallurgy, copper may be cost effectively used as opposed to the costly machining techniques from raw metal stock. The heat sink of the present invention provides a low-cost, high heat dissipation heat sink for semiconductor applications.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A system having a heat sink structure for semiconductor devices, said system comprising:
   at least one semiconductor device having a heat sink in thermal communication therewith, said heat sink comprising;
      a first fin layer having a flat top surface and having a recess extending into the flat top surface; and
      at least one second fin layer and having a bottom surface, a generally centrally located shoulder region extending from the bottom surface, and a generally centrally located buttonlike projection extending from the shoulder projection, wherein said buttonlike projection of the at least one second fin layer extends into and forms an interference fit with the recess of the first fin layer.

2. The system of claim 1, wherein the fin layers have a circular outline.

3. The system of claim 1, wherein the button-like projection is tapered.

4. The system of claim 1, wherein the recess is chamfered.

5. The system of claim 1, wherein the button-like projection is chamfered.

6. The system of claim 1, wherein the first and the at least one second fin layers are formed of powdered metal.

7. The system of claim 6, wherein the first and the at least one second fin layers are formed of copper.

8. The system of claim 1, further comprising:
- a gas relief groove formed in a side wall of the recess of the first fin layer.

9. The system of claim 1, further comprising:
- a gas relief groove formed in a side wall of the buttonlike projection of the at least one second fin layer.

10. The system of claim 1, further comprising:
- a gas relief hole extending into the button-like projection and completely through at least one second fin layer.

11. The system of claim 1, further comprising: a heat conductive substance disposed between the first fin layer and the at least one second fin layer prior to pressfit assembly.

12. The system of claim 1, wherein the first and at least one second fin layers are identical to one another, each having a top recess, a bottom shoulder projection and a button-like projection.

13. The system of claim 1, comprising:
- a plurality of second fin layers, wherein all of the fin layers except a top-most one of the second fin layers are substantially the same as one another.

14. The system of claim 1, comprising:
- a plurality of second fin layers, wherein all of the fin layers except the first fin layer are substantially the same as one another.

15. The system of claim 1, wherein all of the fin layers except a bottom-most fin layer and a top-most fin layer are substantially the same as one another.

16. The system of claim 1, further comprising an adapter structure having an opening in a top surface thereof sized and shaped to form an interference fit with the button-like projection extending from the first fin layer and assembled to the first fin layer by press-fit of the button-like projection of the first fin layer into the opening of the adapter structure.

17. The system of claim 16, further comprising a button-like projection extending from a bottom surface of the adapter structure.

18. The system of claim 1, wherein the electronic system is a single chip module.

19. The system of claim 1, wherein the electronic system is a multi-chip module having at least one semiconductor device.

20. The system of claim 1, wherein the electronic system is a board level product having a plurality of semiconductor devices on at least one printed wiring board.

21. The system of claim 1, wherein the electronic system is a box level system having a plurality of semiconductor devices on at least one printed wiring board mounted into a box with a power source.

22. The system of claim 1, wherein the electronic system is a computer system.

23. The system of claim 1, wherein the electronic system is an information and entertainment transmission system.

24. The system of claim 1, wherein the electronic system is an entertainment system.

25. The system of claim 1, wherein the electronic system is a security and surveillance system.

26. The system of claim 1, wherein the electronic system is an information, data acquisition and control system.

27. The system of claim 1, wherein the electronic system is utilized in a transportation system.

* * * * *